United States Patent [19]
Jensen et al.

[11] Patent Number: 6,027,948
[45] Date of Patent: Feb. 22, 2000

[54] METHOD TO PERMIT HIGH TEMPERATURE ASSEMBLY PROCESSES FOR MAGNETICALLY SENSITIVE DEVICES

[75] Inventors: Ronald J. Jensen, Bloomington; Richard K. Spielberger, Maple Grove; Allan T. Hurst, Anoka; Jeff Sather, Medina, all of Minn.

[73] Assignee: Honeywell International Inc., Minneapolis, Minn.

[21] Appl. No.: 08/940,587

[22] Filed: Sep. 30, 1997

[51] Int. Cl.[7] .................... H01L 21/54; H01L 21/58; H01L 21/70

[52] U.S. Cl. ................. 438/3; 438/108; 438/118

[58] Field of Search ................ 438/3, 108, 118

[56] References Cited

U.S. PATENT DOCUMENTS 5,387,551   2/1995   Mizoguchi et al. .

*Primary Examiner*—David E. Graybill
*Attorney, Agent, or Firm*—Gregory A. Bruns

[57] ABSTRACT

A method for performing an elevated temperature process on an integrated device whereby a magnetic field is used to maintain the alignment of magnetic domains in magnetically sensitive materials.

14 Claims, 4 Drawing Sheets

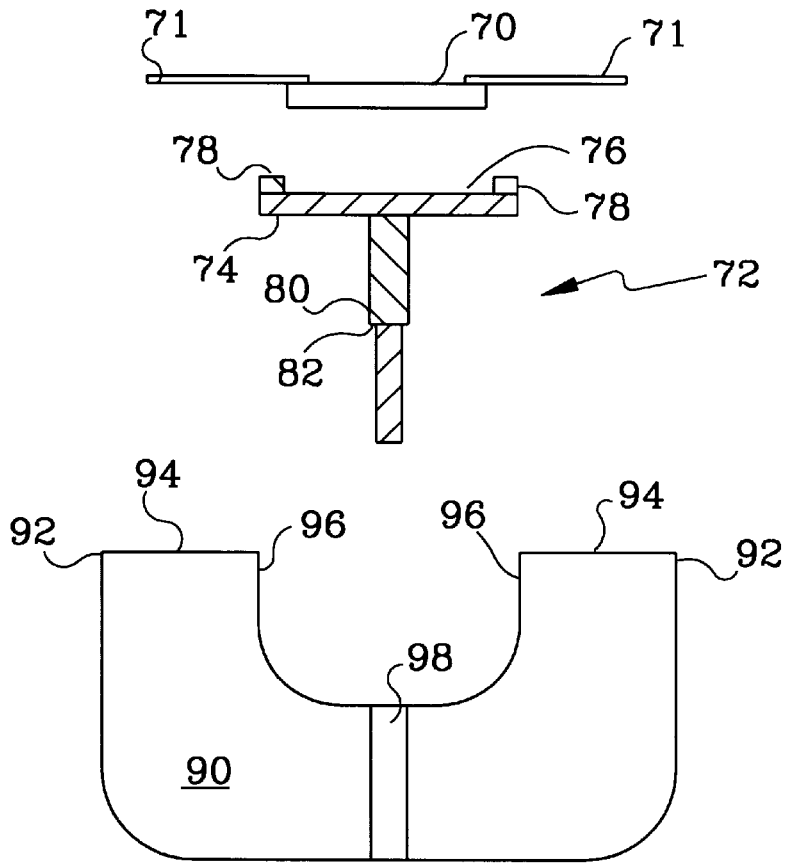
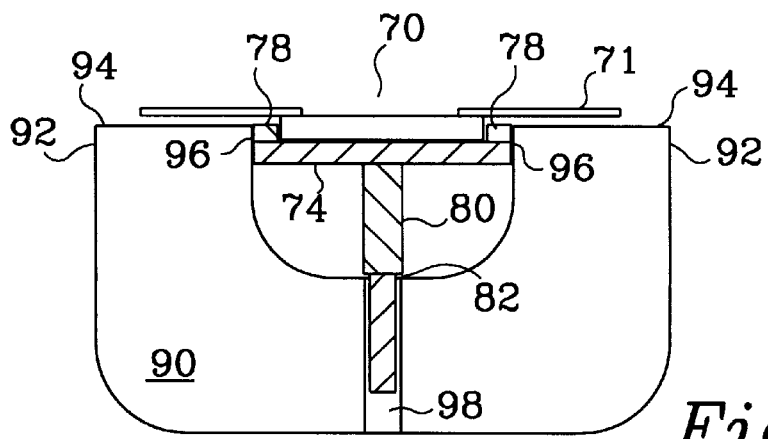
Fig. 4a
Fig. 4b

METHOD TO PERMIT HIGH TEMPERATURE ASSEMBLY PROCESSES FOR MAGNETICALLY SENSITIVE DEVICES

BACKGROUND OF THE INVENTION

The U.S. government has rights in this invention pursuant to Contract No. N00030-96-C0014 awarded by The Department of the Navy.

This invention relates generally to assembly processes for integrated circuits and particularly to assembly processes for magnetically sensitive devices. One example of a magnetically sensitive device is a thin film magnetoresistive memory device. Such memory devices can be fabricated on the surface of a semiconductor wafer. Another example of a magnetically sensitive device is a magnetic sensor fabricated on a semiconductor material. Many applications of memory devices require hermetic packaging. The integrated circuit packaging processes associated with hermetic packaging typically use a die attach process, e.g., gold silicon eutectic which requires temperatures in excess of 400° C. and up to 450° C. Similarly, a glass die attach process requires temperatures higher than 400° C. Solder die attach processes typically require temperatures around 325° C.

A second process done at elevated temperature is flip chip or solder reflow for electrically connecting chips to next level of packaging. Solder reflow typically requires temperatures of 200° C. to 350° C.

A third process related to hermetic packaging that typically occur at elevated temperature is the lid seal process. One lid seal process uses a gold tin eutectic which melts at 280° C. and the sealing process uses temperatures around 330° C.

The fabrication of thin film magnetic memory devices includes processes, e.g., annealing, which cause a certain alignment or ordering of magnetic domains within the magnetic material. For example, the magnetic material is deposited in the presence of a known magnetic field, and this is followed by an annealing process. Once this ordering or alignment is completed, the temperature of the memory device must be kept below a certain temperature to assure that the alignment or ordering of magnetic domains is maintained. Various factors affect the maximum temperature that the memory device may be safely subjected to, but for some devices it is desirable to not perform any processes at temperatures higher than 150° C.

In high reliability devices it is not desirable to use organic die attach materials because of later high temperature processes which liberate moisture. Therefore, certain epoxy materials may not be used.

Thus a need exists for a method of using the typical elevated temperature processes used for semiconductor devices for the packaging of devices containing magnetized materials.

SUMMARY OF THE INVENTION

The present invention solves these and other needs by providing a method of performing an elevated temperature assembly process on a device which includes magnetized materials comprising the steps of:

providing a device which includes a magnetized material portion having an easy axis;
providing a magnetic field, said magnetic field having a first value and a first direction;
providing a part;
positioning said part and said device in said magnetic field with said easy axis of said magnetized material portion oriented in said first direction;
performing a process which causes an increase in a temperature of said part and said device from a first temperature range to a second temperature range;
cooling said part and said device to a third temperature; and
removing said device from said magnetic field.

BRIEF DESCRIPTION OF THE DRAWINGS

FIG. 3b is a cross sectional view according to section line b—b of FIG. 3a.

FIG. 4a is an exploded elevation view of another implementation of the present invention.

FIG. 4b is an elevation view of the implementation of FIG. 4a of the present invention.

FIGS. 5a, 5b and 5c illustrate various implementations of the present invention.

DETAILED DESCRIPTION

Figure 1A:
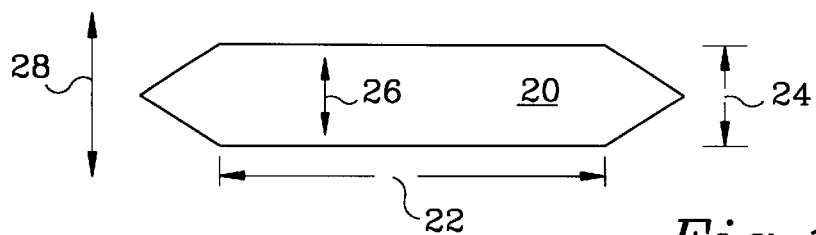
FIGS. 1a and 1b are plan views of a single element of magnetized material and an integrated device which includes magnetized materials respectively.

FIG. 1a is a top plan view of a single element of magnetic material having a length 22 and a width 24. A magnetic field 28 applied during deposition and annealing of the magnetic material largely determines a direction of the easy axis of the element 20. Thus the desired easy axis may be established to be parallel to the length of element 20 or perpendicular to length 22 as illustrated by the arrow 26. Edge effects and temperature can skew the actual easy axis from the desired easy axis. In addition, there is some distribution or dispersion of directions of the easy axis centered about the actual easy axis.

Figure 1B:
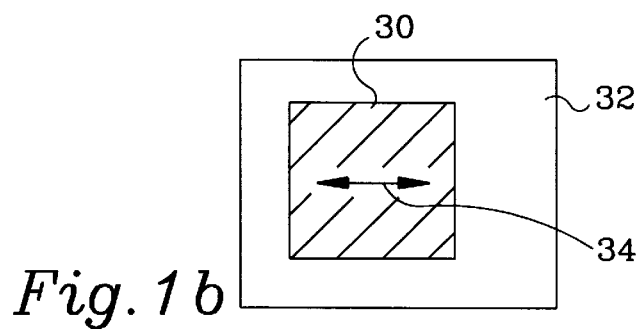

To make a usable device, elements such as element 20 are deposited in very large numbers onto a semiconductor as shown in FIG. 1b. FIG. 1b is a top plan view of an integrated semiconductor device or die 32 which includes an area 30 where a large number of elements 20 are located. The magnetic elements 20 are all oriented to have an easy axis in a direction as indicated by arrow 34.

Figure 2A:
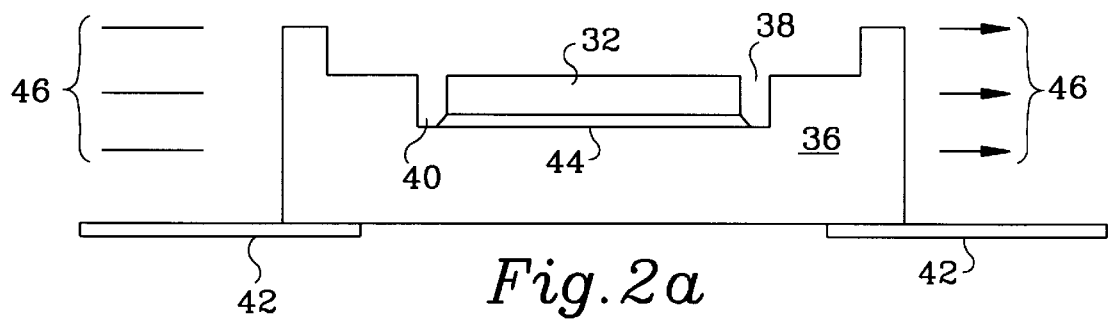
FIGS. 2a and 2b are sectional views of a semiconductor package including the integrated device of FIG. 1b.

FIG. 2a is a sectional view of a semiconductor package 36 including a chip cavity 38, die mounting surface 40 and leads 42. Chip or die 32 is an integrated device containing magnetized materials such as, for example, a large number of elements 20.

In accordance with the present invention, integrated device 32 is placed in package 36 after a die attach material 44 is located on die mounting surface 40. The combination of device 32 and package 36 are then heated from a temperature in the range of room temperature to a temperature in a range sufficient to cause the die attach material to flow. During this process of heating and the process of cooling, a magnetic field 46 is continuously applied.

Upon completion of the die bonding process, intermediate processes will typically be performed. These include, for example, making wire bonds 48 between pads on die 32 and pads on package 36. The wire bonding may be performed at temperatures within a normal room temperature range. An alternate is flip chip bonding which typically occurs at elevated temperatures as required for solder reflow, for example, 200° C. to 350° C.

Figure 2B:
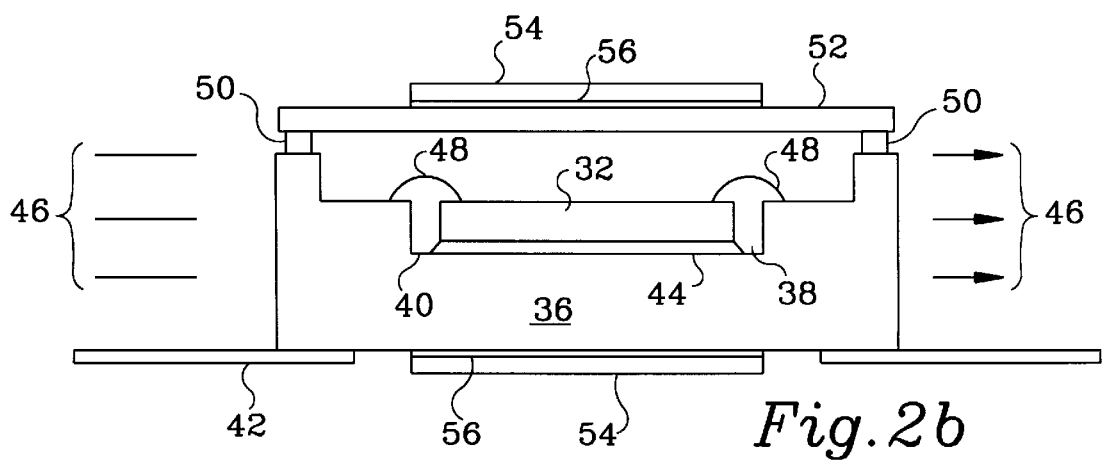

The packaging of device 32 will frequently include a lid seal process which results in device 32 and package 36 again being subjected to an elevated temperature. Referring to FIG. 2b which shows a lid seal method where a solder preform 50 is placed on package 36 and lid 52 is placed on preform 50. A gold tin preform may be used with a ceramic or metal lid and the assembly can then be heated in a furnace to cause preform 50 to reflow with magnetic field 46 activated during this process.

FIG. 2b also shows shielding material 54 and attachment material 56 located on lid 52 and on the lower surface of package 36. The method of applying attachment material 56 and shielding material 54 will typically include process temperatures above 150° C.

FIGS. 2a and 2b illustrate the principle of the present invention. Those of ordinary skill in the art will recognize that many variations are possible. For example, magnetic field 46 may be provided by a variety of means. These include but are not limited to permanent magnet arrangements, electromagnet arrangements, coil arrangements, for example, solenoid coils or Helmholtz coils. The magnetic field may be arranged to apply to a single package or to multiple packages simultaneously.

Figure 3A:
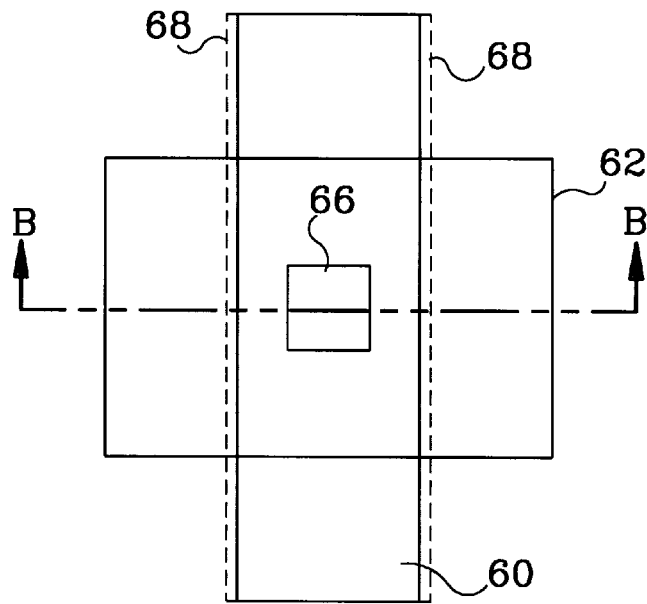
FIG. 3a is a top plan view of one implementation of the present invention.
Figure 3B:
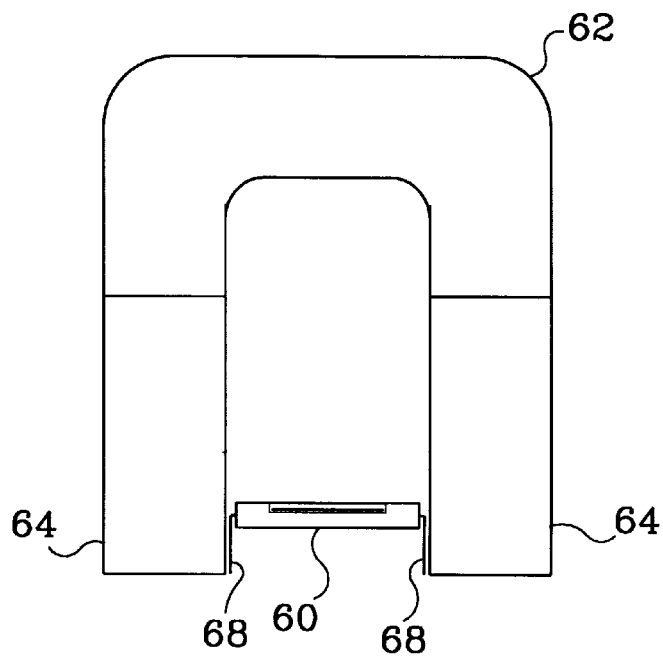

FIGS. 3a and 3b show an example of one test configuration used to verify the method of the present invention where the package is a dual-in-line package 60. The magnetic field is provided by a permanent magnet 62 in a horseshoe or "U" shaped configuration with steel pole pieces 64. The top plan view of FIG. 3a shows integrated device 66 which includes magnetized materials, within package 60. The elevation view of FIG. 3b shows pole pieces 64 and package 60 including leads 68.

FIGS. 4a and 4b show an example of a further developed configuration of the present invention where the package is a dual-leaded flatpack 70 including leads 71. Fixture 72 includes support member 74 having a surface 76 for receiving package 70. Alignment and positioning members 78 serve to align package 70 on surface 76. Permanent magnet 90 is a "U" shaped or horseshoe magnet having end or poles 92, having surfaces 94 and 96. Magnet 90 also includes hole 98 which is perpendicular to surfaces 94. Pedestal or shaft 80 extends perpendicularly from member 74 and is received in hole 98. Shaft 80 has a shoulder 82 which abuts magnet 90 at hole 98 to limit movement of fixture 72 in a direction perpendicular to surfaces 94.

In use, an integrated device or die (not shown), which includes magnetized materials, is oriented properly in flatpack 70 in relation to the magnetic field produced by magnet 90. Package 70 is placed on surface 76 of fixture 72. Fixture 72 including package 70 is located or keyed into position with package 70 positioned between poles 92 of magnet 90. The combination of a die, package 70, fixture 72, and magnet 90 is then ready for an elevated temperature assembly process. Fixture 72 may be constructed from a variety of nonmagnetic materials suitable for use at the process temperature. Aluminum, for example, is a satisfactory material for fixture 72.

An advantage of the implementation of FIGS. 4a and 4b includes the fact that the combination of magnet 90, package 70 and fixture 72, along with a magnetically sensitive device, forms a self-contained unit. This unit may undergo elevated temperature processes without any additional alignment consideration. The arrangement of FIG. 4a and 4b is believed to provide a magnetic field in the range of 400–600 Oersteds. The magnetic field applied should be greater than the effective magnetic anisotropy field, i.e., $H_K$ effective, of the magnetized materials portion of the device. The principles of the present invention apply with much lower magnetic fields, for example, for magnetoresistive random access memory device films, a magnetic field value greater than 20 Oersteds is believed to be sufficient.

While a rather conventional package has been shown in FIGS. 2a and 2b, the present invention also applies to less conventional packaging approaches. One example would be an elevated temperature process for attaching a die containing magnetized materials to a flexible tape material. Another example would be where a die is encapsulated in a material and this process is performed at an elevated temperature. Various other non-conventional arrangements would come within the scope of the present invention.

Figure 5A:
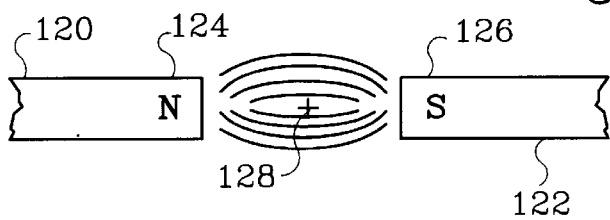

A magnetic field may be provided by various means. Some examples include combinations of bar magnets, single coil arrangements and combination coil arrangements. FIG. 5a illustrates a bar magnet 120 and a bar magnet 122 wherein a magnetic field is established between end 124 and end 126, and a device containing magnetized materials could be located at 128.

FIG. 5b illustrates a single coil 130 including a number of turns of a conductor carrying current I, that would establish a magnetic field within coil 130 and a device containing magnetized materials could be located at 132.

FIG. 5c illustrates a dual coil arrangement with coil 140 and coil 142 each including a number of turns of a conductor carrying a current I. A magnetic field is established between coil 140 and coil 142 and a device containing magnetized materials could be located at 144.

Figure 6:
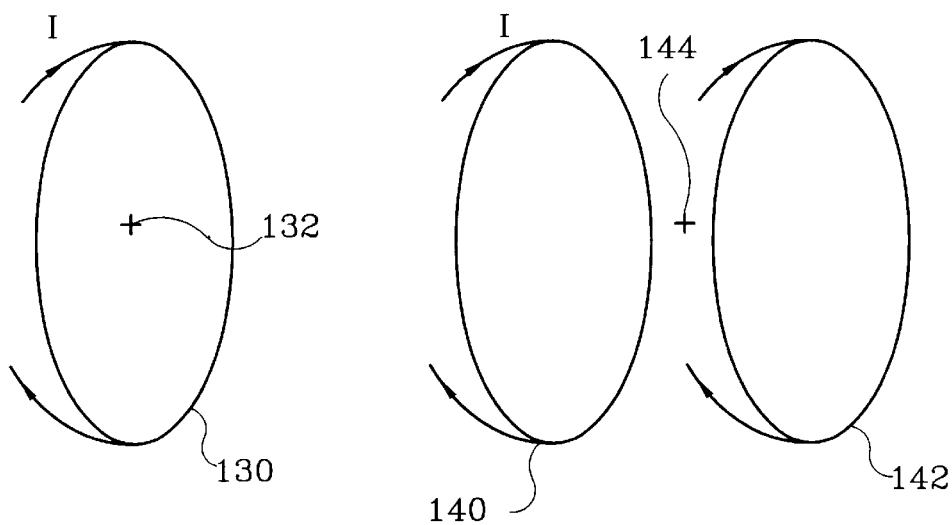
FIG. 6 is an elevation view of another implementation of the present invention.
Figure 6:
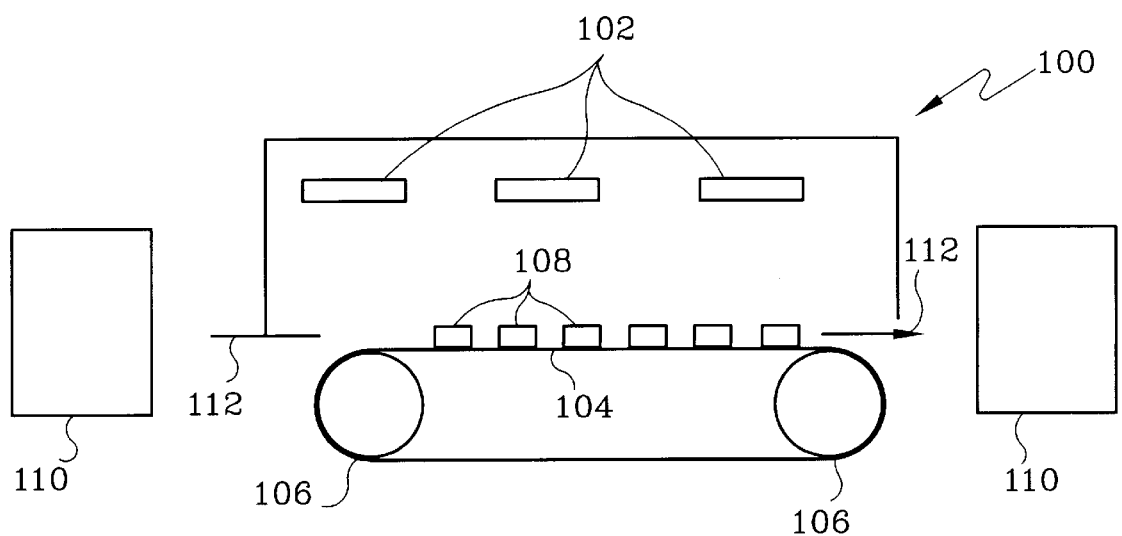

FIG. 6 shows one implementation of the present invention where a magnetic field is applied simultaneously to a number of devices containing magnetized materials. In FIG. 5, a belt furnace 100 includes heating means 102 and transport means such as belt 104 moved by rollers 106. Devices 108 at some stage of packaging are shown on belt 104. A magnetic field 112 is provided along an easy axis of devices 108 by magnetic field producing means 110. The implementation of FIG. 6 offers the advantages of processing a large number of integrated devices simultaneously. Magnetic field producing means 110 may be, for example, permanent magnets, electromagnets, coil arrangements or other means.

The present invention has been discussed with reference to high reliability package parts and process temperature over 400° C. However, the method of the present invention also applies to other packaging materials, for example, plastic, where the process temperatures may be substantially lower.

The scope of the invention is to be indicated by the appended claims rather than the foregoing description.

We claim:

1. A method of performing an elevated temperature assembly process on a device which includes magnetized materials comprising the steps of:

providing a device which includes a magnetized material portion having an easy axis;

providing a magnetic field, said magnetic field having a first value and a first direction;

providing a part;

positioning said part and said device in said magnetic field with said easy axis of said magnetized material portion oriented in said first direction;

performing a process which causes an increase in a temperature of said part and said device from a first temperature range to a second temperature range;

cooling said part and said device to a third temperature; and removing said device from said magnetic field.

2. Method of claim 1 wherein said magnetic field has a value greater than the effective $H_K$ of said magnetized material portion.

3. Method of claim 2 wherein said magnetic field has a value greater than 20 Oersteds.

4. Method of claim 1 wherein said second temperature range is from about 150° C. to about 500° C.

5. Method of claim 1 wherein said step of providing a magnetic field comprises providing at least one permanent magnet.

6. Method of claim 5 wherein said step of providing at least one permanent magnet comprises providing a U-shaped magnet having a first end and a second end and the step of positioning said device comprises the step of providing a fixture fitted to a portion of said U-shaped magnet, said fixture for holding a package containing said device in a fixed relation to said first end and said second end.

7. Method of claim 6 wherein said magnetic field has a value greater than 20 Oersteds.

8. Method of claim 7 wherein said second temperature range is from about 150° C. to about 500° C.

9. Method of claim 4 wherein said step of performing a process comprises bonding said device to a package.

10. Method of claim 9 further comprising the steps of:

performing intermediate steps;

providing a lid for said package;

positioning said lid on said package;

heating said lid and said package to seal said lid to said package.

11. Method of claim 1 wherein said step of providing a magnetic field comprises providing a conductor in the form of a coil; and passing a current through said coil.

12. A method of performing an elevated temperature assembly process on a device which includes magnetized materials comprising the steps of:

providing a device which includes a magnetized material portion having an easy axis;

providing a package for said device;

providing a magnetic field, said magnetic field having a first value and a first direction;

positioning said package containing said device in said magnetic field with said easy axis of said magnetized material portion oriented in said first direction;

performing a process which causes an increase in a temperature of said device from a first temperature to a second temperature;

cooling said device to a third temperature; and removing said device from said magnetic field.

13. Method of claim 12 further comprising the steps of:

performing intermediate steps;

providing a lid for said package; and positioning said lid on said package; and heating said lid and said package to seal said lid to said package.

14. Method of claim 12 wherein said performing a process is selected from a group consisting of die attach, lid seal, flip chip bonding, and shield attach.

* * * * *